United States Patent
Chen et al.

(10) Patent No.: US 12,431,358 B2
(45) Date of Patent: Sep. 30, 2025

(54) METHODS AND MATERIALS FOR ENHANCED BARRIER PERFORMANCE AND REDUCED VIA RESISTANCE

(71) Applicant: Applied Materials, Inc., Santa Clara, CA (US)

(72) Inventors: Lu Chen, Cupertino, CA (US); Seshadri Ganguli, Sunnyvale, CA (US); Sang Ho Yu, Cupertino, CA (US); Feng Chen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 697 days.

(21) Appl. No.: 17/072,806

(22) Filed: Oct. 16, 2020

(65) Prior Publication Data
US 2022/0122923 A1    Apr. 21, 2022

(51) Int. Cl.
| | |
|---|---|
| H01L 21/285 | (2006.01) |
| B22F 1/145 | (2022.01) |
| H01L 21/768 | (2006.01) |
| H01L 23/532 | (2006.01) |

(52) U.S. Cl.
CPC ........ *H01L 21/28562* (2013.01); *B22F 1/145* (2022.01); *H01L 21/76843* (2013.01); *H01L 23/53238* (2013.01); *H01L 23/53252* (2013.01)

(58) Field of Classification Search
None
See application file for complete search history.

(56) References Cited

U.S. PATENT DOCUMENTS

| | | | |
|---|---|---|---|
| 6,284,655 B1* | 9/2001 | Marsh | H01L 21/76849 438/650 |
| 2003/0186539 A1 | 10/2003 | Lee et al. | |
| 2007/0036894 A1* | 2/2007 | Thompson | C07C 251/12 556/42 |
| 2007/0054047 A1* | 3/2007 | Ishizaka | C23C 16/16 427/248.1 |
| 2007/0069177 A1* | 3/2007 | Peters | C07F 17/00 252/500 |
| 2008/0194105 A1* | 8/2008 | Dominguez | C23C 16/18 257/E21.171 |

(Continued)

FOREIGN PATENT DOCUMENTS

| | | |
|---|---|---|
| CN | 104221132 A | 12/2014 |
| KR | 100936490 B1 | 1/2010 |
| WO | 01/15220 A1 | 3/2001 |

OTHER PUBLICATIONS

PCT International Search Report and Written Opinion in PCT/US2021/042376 dated Nov. 5, 2021, 10 pages.

*Primary Examiner* — Katie L. Hammer
(74) *Attorney, Agent, or Firm* — SERVILLA WHITNEY LLC

(57) ABSTRACT

Embodiments of the disclosure relate to methods and materials for forming barrier layers with enhanced barrier performance and/or reduced via resistance. Some embodiments of the disclosure provide methods for passivating a metal surface by exposing the metal surface to a metal complex comprising an organic ligand with at least three carbon atoms and a double or triple bond that eta bonds with a central metal atom. Some embodiments provide barrier layers within vias which enable a reduction in resistance of at least 25% as a result of thinner barrier layers with equivalent barrier properties.

20 Claims, 2 Drawing Sheets

(56) References Cited

U.S. PATENT DOCUMENTS

| | | |
|---|---|---|
| 2016/0056071 A1 | 2/2016 | Draeger et al. |
| 2016/0163591 A1 | 6/2016 | Ishizaka et al. |
| 2017/0342553 A1 | 11/2017 | Yu et al. |
| 2018/0130666 A1 | 5/2018 | Rahtu et al. |
| 2018/0233350 A1* | 8/2018 | Tois .................... H01L 21/0272 |
| 2019/0077819 A1* | 3/2019 | Girolami ............. C07F 15/0033 |
| 2019/0341304 A1 | 11/2019 | Ganguli et al. |

* cited by examiner

METHODS AND MATERIALS FOR ENHANCED BARRIER PERFORMANCE AND REDUCED VIA RESISTANCE

TECHNICAL FIELD

Embodiments of the disclosure generally relate to methods and materials which are useful in forming via interconnects. In particular, embodiments of disclosure provide diffusion barriers with enhanced performance and/or via interconnects with reduced resistance.

BACKGROUND

Several methods for manufacturing electronic devices rely on the interconnection of metallic layers through interconnects in a dielectric material. These interconnects are often formed through small vias. As technology nodes become increasing smaller, vias are required to have smaller diameters in order to facilitate high device densities on substrates.

The interconnect typically consists of a via with a metallic bottom and dielectric sidewalls. The via is coated with a barrier layer to prevent metal diffusion into the dielectric and a metal fil material is deposited into the via to electrically connect the metallic material at the bottom with the top surface of the via.

Resistance of the electrical path through the via is directly related to the thickness of the barrier layer. For example, thinner barrier layers allow for an increased volume of metal within the via, thereby lowering via resistance. Also, as the barrier layer covers the metallic bottom, a thicker barrier layer between the metal bottom and the metal fill yields increased resistance.

Tantalum nitride (TaN) is a material of particular interest as a barrier layer in via interconnects. The atomic layer deposition (ALD) of TaN generally provides films with better barrier performance (for equivalent thickness) at higher deposition temperatures. Yet, at higher deposition temperatures, the selectivity of ALD TaN increasingly favors deposition on the metal bottom rather than the dielectric sidewalls of the via. This selectivity effect leads to thicker films on the bottom surface and increases resistance.

Accordingly, there is a need for methods and materials to improve barrier performance, to reduce barrier film thickness on the bottom surface and to reduce via resistance.

SUMMARY

One or more embodiments of the disclosure are directed to a method of passivating a metal surface. The method comprises exposing the metal surface to a metal complex to form a passivated metal surface. The metal complex comprises a metal atom and an organic ligand with at least three carbon atoms and a double or triple bond that eta bonds with the metal atom.

Additional embodiments of the disclosure are directed to a method of depositing a barrier layer. The method comprises exposing a substrate surface comprising a metal surface and a dielectric surface to a first metal complex to form a treated substrate surface. The treated substrate surface comprises a treated metal surface and a treated dielectric surface. The first metal complex comprises a first metal atom and an organic ligand with at least three carbon atoms and a double or triple bond that eta bonds with the first metal atom. The treated substrate surface is sequentially exposed to a second metal precursor and a reactant to form a barrier layer on the treated substrate surface.

Further embodiments of the disclosure are directed to a method of forming a via barrier layer. The method comprises soaking a substrate surface with a first metal complex. The substrate surface has a via formed therein. The via has sidewalls and a bottom surface. The sidewalls are a dielectric surface and the bottom surface is a metal surface. The first metal complex adsorbing to the metal surface to form a treated metal surface. The first metal complex comprises a first metal atom and an organic ligand with at least three carbon atoms and a double or triple bond that eta bonds with the first metal atom. The substrate surface is sequentially exposed to a second metal precursor and a reactant to form a barrier layer. A metal layer is deposited on the barrier layer to at least partially fill the via.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure are directed to methods of passivating a metal surface. Some embodiments advantageously reduce the thickness of a film deposited on the passivated metal surface by at least 20%.

Figure 1:
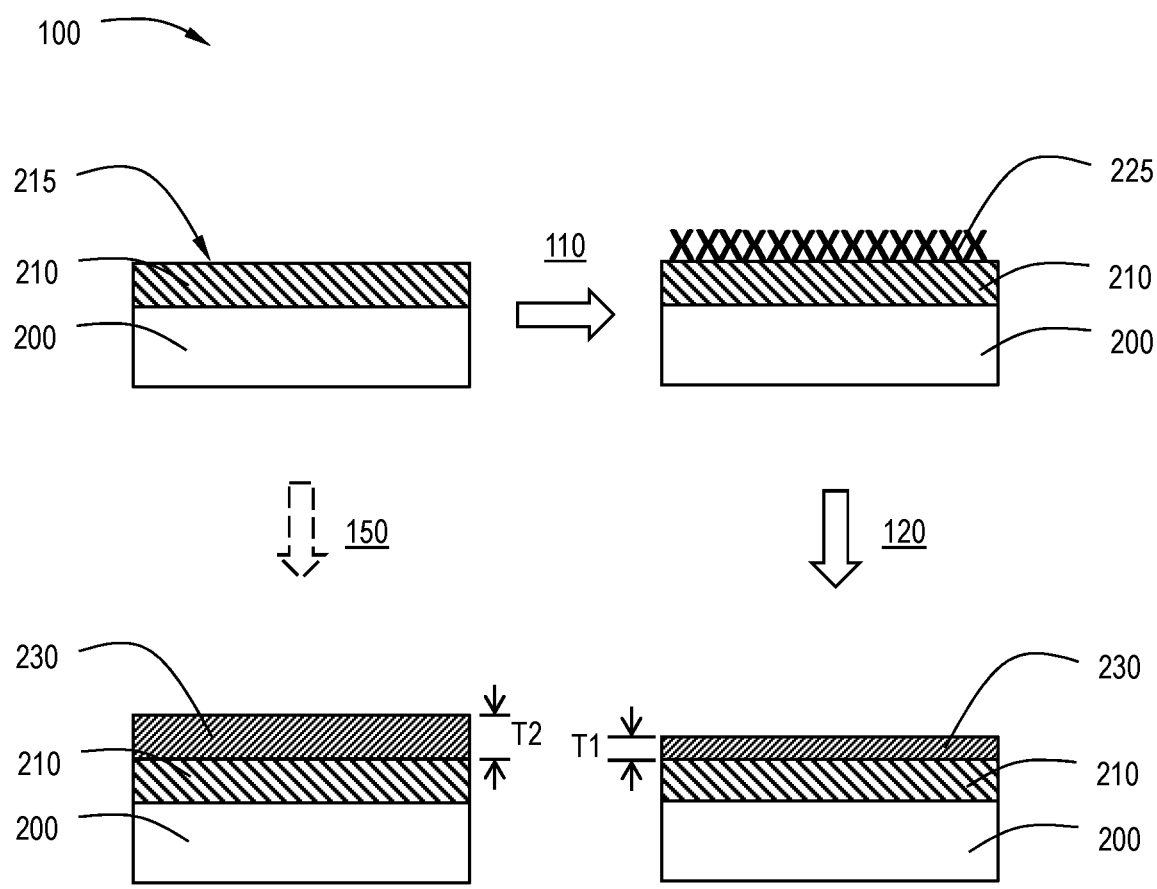
FIG. 1 illustrates a cross-sectional view of an exemplary substrate during processing according to one or more embodiment of the disclosure.

Referring to FIG. 1, a method 100 is shown for processing an exemplary substrate 200 according to one or more embodiment of the disclosure. The substrate 200 comprises a metal material 210 having a metal surface 215. In some embodiments, the metal surface comprises one or more of copper, cobalt, tungsten, molybdenum or ruthenium. In some embodiments, the metal surface consists essentially of copper. In some embodiments, the metal surface consists essentially of ruthenium. In some embodiments, the metal surface consists essentially of molybdenum. As used in this regard, a surface which "consists essentially of" a stated material comprises greater than or equal to 95%, greater than or equal to 98%, greater than or equal to 99% or greater than or equal to 99.5% of the stated material on an atomic count basis.

At 110, the metal surface 215 is exposed to a metal complex to form a passivated metal surface 225. The metal complex comprises a metal atom and an organic ligand with at least three carbon atoms and a double or triple bond that eta bonds with the metal atom.

In some embodiments, exposing the metal surface 215 to a metal complex comprises soaking a substrate 200 comprising the metal surface 215 in the metal complex. In some embodiments, the substrate 200 is soaked for a period of time in a range of 1 second to 20 seconds, in a range of 2 seconds to 15 seconds, in a range of 3 seconds to 10 seconds, or in a range of 2 seconds to 5 seconds.

In some embodiments, the metal complex comprises a compound with the general formula $M(NR_2)_3L$, see structure (I),

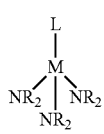

(I)

where M is a metal, each R is independently selected from the group consisting of H and C1-C5 alkyl, and L is an organic ligand with at least three carbon atoms and a double or triple bond that eta (η) bonds with the metal atom. As used in this manner, an eta (η) bond refers to a ligand that coordinates to the metal atom through at least two contiguous atoms.

In some embodiments, the metal atom (M) comprises, consists essentially of or consists of tantalum. In some embodiments, the term "consists essentially of" means that greater than or equal to about 95%, 98%, 99% or 99.5% of the metal atoms are the stated species, on an atomic basis.

In some embodiments, the organic ligand coordinates to the metal atom via an $\eta^2$ bond in which two contiguous atoms coordinate to the metal atom. In some embodiments, the organic ligand comprises in the range of 3 to 18 carbon atoms. In some embodiments, the organic ligand comprises greater than or equal to three carbon atoms with a double bond. In some embodiments, the organic ligand comprises greater than or equal to three carbon atoms with a triple bond.

In some embodiments, the organic ligand comprises at least one non-terminal double and/or triple bond. As used in this manner, a terminal bond means any bond involving an atom that forms the end of a chain of atoms, excluding hydrogen atoms. For example, 2-butene, with a double bond between the second and third carbon atoms, has a non-terminal double bond. In contrast, butene, with a double bond between the first and second carbon atom is a terminal double bond.

In some embodiments, the organic ligand has a lower bond energy than each of the $—NR_2$ groups. In some embodiments, the organic ligand comprises an alkene. In some embodiments, the organic ligand comprises an alkyne. In some embodiments, the organic ligand comprises one or more of butene, butyne, pentene, pentyne, hexane, hexyne, heptane, heptyne, octene, octyne, nonene, nonyne, decene or decyne and structural isomers thereof (e.g., 2-butene, 3-hexyne). In some embodiments, the organic ligand comprises a cycloalkene. In some embodiments, the organic ligand comprises one or more of cyclopentene, cyclopentadiene, cyclohexene, 1,3-cyclohexadiene, 1,4-cyclohexadiene, benzene, and alkyl substituted derivatives thereof (e.g., methylcyclopentadiene).

The organic ligand bonds to the metal surface 215 to form a passivated metal surface 225 and inhibit deposition thereon. In some embodiments, at 120, a film 230 is deposited on the passivated metal surface 225. As shown in FIG. 1, the film 230 deposited on the passivated metal surface 225 has a thickness T1. In contrast, when film 230 is deposited on the metal surface 215 without passivation, as shown at 150, the film 230 has a thickness T2.

T1 is less than T2. In some embodiments, T1 is at least 5% less than T2, at least 10% less than T2, at least 20% less than T2, at least 25% less than T2, at least 30% less than T2, or at least 50% less than T2.

Figure 2:
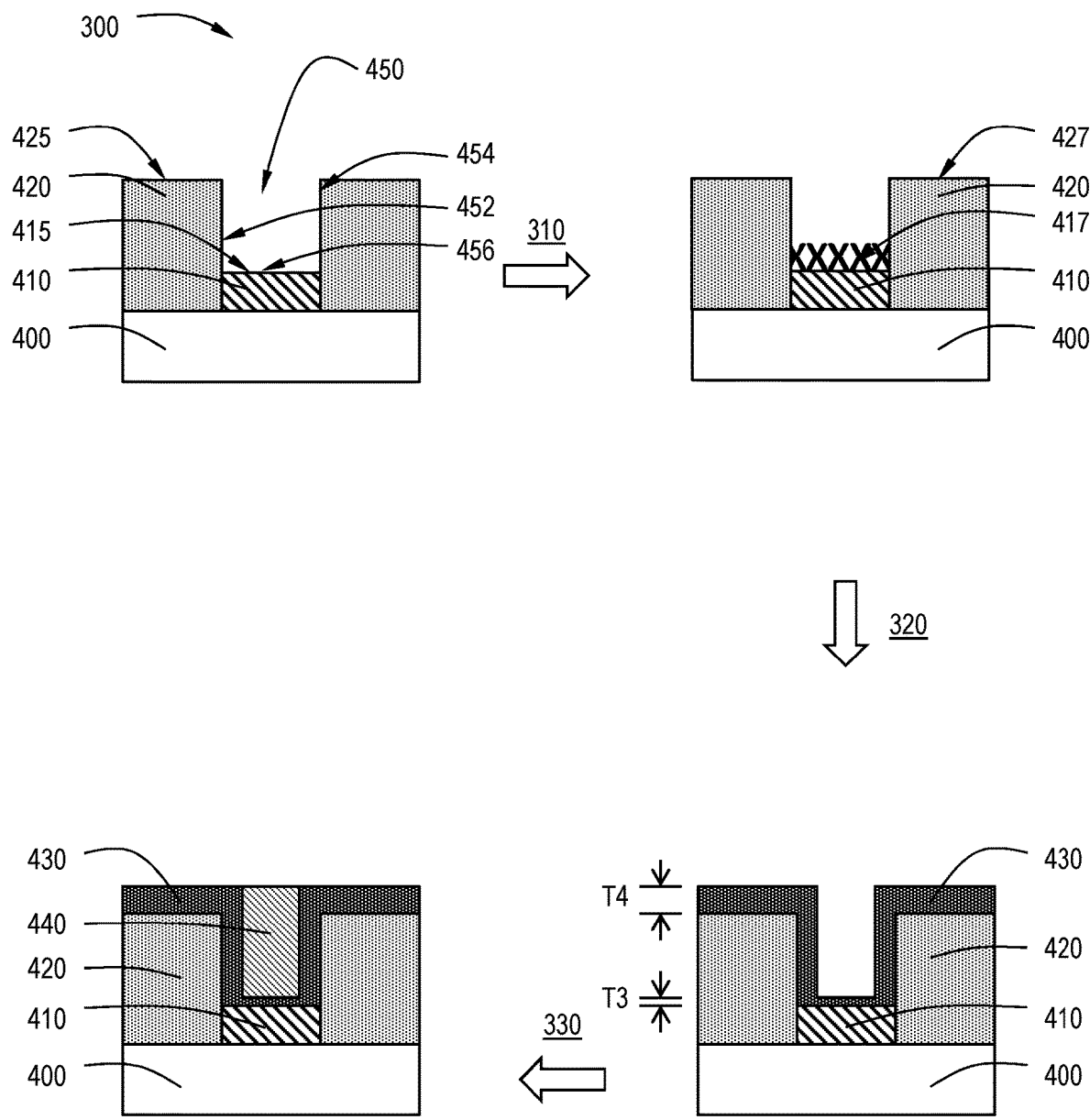
FIG. 2 illustrates a cross-sectional view of an exemplary substrate during processing according to one or more embodiment of the disclosure.

Referring to FIG. 2, a method 300 is shown for depositing a barrier layer 430 on a treated substrate surface. The method 300 begins with a substrate 400 comprising a substrate surface. The substrate 400 comprises a metal material 410 with a metal surface 415 and a dielectric material 420 with a dielectric surface 425. The substrate surface will be understood by one skilled in the art to comprise the metal surface 415 and the dielectric surface 425. The metal material 410 may be selected from the same materials identified above with respect to metal material 210.

In some embodiments, as shown in FIG. 2, the substrate surface has a via 450 formed therein. The via 450 has sidewalls 452, 454 and a bottom 456. As shown in FIG. 2, the sidewalls 452, 454 are a dielectric surface 425 and the bottom 456 is a metal surface 415. This arrangement of materials/surfaces and portions of the via 450 is merely exemplary and is not intended to limit the scope of this disclosure.

At 310, the substrate 400 is exposed to a first metal complex to form a treated substrate surface. The treated substrate surface will be understood by one skilled in the art to comprise a treated metal surface 417 and a treated dielectric surface 427. The first metal complex and exposing the substrate thereto is described above with respect to method 100.

Without being bound by theory, it is believed that the first metal complex has a greater bonding affinity for the metal surface 415. Accordingly, while it is assumed that the first metal complex will interact with both the metal surface 415 and the dielectric surface 425, the density of the first metal complex is expected to be higher on the metal surface 415 than the dielectric surface 425 after the substrate 400 is exposed to the first metal complex. So, while the first metal complex (shown as X) is only shown in FIG. 2 on the metal surface 415 to form the treated metal surface 417, it will be understood by one skilled in the art that at least some of the first metal complex will also be present on the dielectric surface 425 to form a treated dielectric surface 427.

Stated differently, in some embodiments, the first metal complex selectively adsorbs to the metal surface 415 over the dielectric surface 425. In some embodiments, the quantity of first metal complex per unit area on the metal surface 415 is greater than the quantity of first metal complex per unit area on the dielectric surface 425 by a factor of greater than or equal to 2, greater than or equal to 5, greater than or equal to 10, greater than or equal to 25 or greater than or equal to 50.

In some embodiments, the treated substrate surface is purged with an inert gas after exposure to the first metal complex. Without being bound by theory, as stated above, it is believed that the bonding of the first metal complex to the metal surface 415 is stronger than the bonding of the first metal complex to the dielectric surface 425. Accordingly, the inert gas purge is believed to be useful in removing first metal complex from the dielectric surface 425 with little to no impact on the first metal complex on the metal surface 415.

At 320, the treated substrate surface is sequentially exposed to a second metal precursor and a reactant to form a barrier layer 430 on the treated substrate surface. In some embodiments, formation of the barrier layer is performed by atomic layer deposition (ALD).

As explained above, the presence of the first metal complex on the metal surface inhibits deposition on the metal surface. Accordingly, in some embodiments, the second metal precursor selectively adsorbs on the treated dielectric surface 427 over the treated metal surface 417.

The barrier layer 430 is selectively formed on the treated dielectric surface 427 over the treated metal surface 417. The barrier layer 430 has a thickness T3 on the treated metal surface 417 and a thickness T4 on the treated dielectric surface 427. In some embodiments, T3 is less than T4 by at least 5%, at least 10%, at least 15%, at least 20%, at least 25%, at least 30%, at least 40% or at least 50%. Without being bound by theory, it is believed that the reduced thickness on the metal surface provides reduced resistance for the fully formed via interconnect. Accordingly, one or more method of this disclosure advantageously provides via interconnects with reduced resistance.

In some embodiments, the first metal complex and the second metal precursor comprise the same metal. In some embodiments, the first metal complex and the second metal precursor comprise tantalum. In some embodiments, the first metal complex and the second metal precursor comprise different metals.

In some embodiments, the barrier layer 430 comprises tantalum. In some embodiments, the barrier layer comprises or consists of tantalum nitride. In some embodiments, the second metal precursor comprises pentakis(dimethylamino) tantalum (PDMAT, $Ta(N(CH_3)_2)_5$). In some embodiments, the reactant comprises ammonia.

In some embodiments, the processing temperature during deposition of the barrier layer 430 is controlled. In some embodiments, the temperature is maintained in a range of 250° C. to 350° C., in a range of 275° C. to 325° C., in a range of 300° C. to 350° C., or in a range of 300° C. to 325° C. In some embodiments, the temperature is maintained at about 325° C.

Without being bound by theory, it is believed that barrier layers, particularly tantalum nitride layers, have superior barrier properties when deposited at higher temperatures. However, higher deposition temperatures typically lead to an increased deposition rate on copper surfaces relative to silicon oxide surfaces. One or more method disclosed herein advantageously allows for the deposition of barrier layers at higher deposition temperatures without a loss in selectivity between metal and dielectric surfaces.

At 330, a metal layer 440 is deposited on the barrier layer 430 to at least partially fill the via 450. In some embodiments, the metal layer 440 comprises or consists essentially of copper. In some embodiments, the metal layer 440 comprises one or more of the materials identified as the metal material 210.

In some embodiments, the metal layer 440 is deposited by physical vapor deposition (PVD). In some embodiments, the metal layer 440 overfills the via 450. In these embodiments, the substrate 400 may be planarized to remove any excess metal layer 440 outside of the via 450.

As mentioned above, one or more method of this disclosure advantageously provides via interconnects with reduced resistance. In some embodiments, the resistance of the via is at least 10%, at least 20%, at least 30%, at least 40% or at least 50% less than the resistance of a similar via with a barrier layer formed without soaking the substrate surface with the first metal complex.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of passivating a metal surface, the method comprising exposing the metal surface to a metal complex to form a passivated metal surface, the metal complex comprising a metal atom and an organic ligand with at least three carbon atoms and a triple bond that eta bonds with the metal atom.

2. The method of claim 1, wherein the metal surface comprises copper, cobalt, tungsten, molybdenum or ruthenium.

3. The method of claim 1, wherein the metal atom consists essentially of tantalum.

4. The method of claim 1, wherein the metal complex has a general formula of $M(NR_2)_3L$, where M is a metal, each R is independently selected from the group consisting of H and C1-C5 alkyl, and L is the organic ligand.

5. The method of claim 4, wherein the M-L bond has a lower bond energy than each of the $M-NR_2$ bonds.

6. The method of claim 1, wherein a film deposited on the passivated metal surface has a thickness that is at least 20% less than the thickness of a film deposited on the metal surface without passivation.

7. A method of depositing a barrier layer, the method comprising:
 exposing a substrate surface comprising a metal surface and a dielectric surface to a first metal complex to form a treated substrate surface, the treated substrate surface comprising a treated metal surface and a treated dielectric surface, the first metal complex having a general formula $M(NR_2)_3L$, where M is the first metal, each R is independently selected from the group consisting of H and C1-C5 alkyl, and L is an organic ligand with at least three carbon atoms and a double or triple bond that eta bonds with the first metal atom; and
 sequentially exposing the treated substrate surface to a second metal precursor and a reactant to form a barrier layer on the treated substrate surface.

8. The method of claim 7, wherein the metal surface comprises copper, cobalt, tungsten or ruthenium.

9. The method of claim 7, wherein the first metal complex selectively adsorbs to the metal surface over the dielectric surface.

10. The method of claim 7, wherein the second metal precursor selectively adsorbs to the treated dielectric surface over the treated metal surface.

11. The method of claim 7, wherein the first metal complex and the second metal precursor comprise tantalum.

12. The method of claim 7, further comprising an inert gas purge of the substrate surface between exposing the treated substrate surface to the first metal complex and sequentially exposing the treated substrate surface.

13. A method of passivating a metal surface, the method comprising exposing the metal surface to a metal complex to form a passivated metal surface, the metal complex having a general formula of $M(NR_2)_3L$, where M is a metal, each R is independently selected from the group consisting of H and C1-C5 alkyl, and L is an organic ligand with at least three carbon atoms and a double or triple bond that eta bonds with the metal atom.

14. The method of claim 13, wherein the metal surface comprises copper, cobalt, tungsten, molybdenum or ruthenium.

15. The method of claim 13, wherein M is tantalum.

16. The method of claim 13, wherein the organic ligand comprises an alkyne.

17. The method of claim 13, wherein the organic ligand comprises a cycloalkene.

18. The method of claim 13, wherein the M-L bond has a lower bond energy than each of the $M-NR_2$ bonds.

19. The method of claim 13, wherein a film deposited on the passivated metal surface has a thickness that is at least 20% less than the thickness of a film deposited on the metal surface without passivation.

20. The method of claim 7, further comprising depositing a metal layer on the barrier layer.

* * * * *